US010355082B2

United States Patent
Kudo et al.

(10) Patent No.: US 10,355,082 B2
(45) Date of Patent: Jul. 16, 2019

(54) SEMICONDUCTOR DEVICE INCLUDING ACTIVE AND DUMMY CELL REGIONS

(71) Applicant: Mitsubishi Electric Corporation, Tokyo (JP)

(72) Inventors: Tomohito Kudo, Tokyo (JP); Yoshihumi Tomomatsu, Tokyo (JP); Hideki Haruguchi, Tokyo (JP); Yasuo Ata, Tokyo (JP)

(73) Assignee: Mitsubishi Electronic Corporation, Tokyo (JP)

( * ) Notice: Subject to any disclaimer, the term of this patent is extended or adjusted under 35 U.S.C. 154(b) by 0 days.

(21) Appl. No.: 15/570,442

(22) PCT Filed: Aug. 19, 2015

(86) PCT No.: PCT/JP2015/073209
§ 371 (c)(1),
(2) Date: Oct. 30, 2017

(87) PCT Pub. No.: WO2017/029719
PCT Pub. Date: Feb. 23, 2017

(65) Prior Publication Data
US 2018/0083101 A1 Mar. 22, 2018

(51) Int. Cl.
*H01L 29/06* (2006.01)
*H01L 29/78* (2006.01)
(Continued)

(52) U.S. Cl.
CPC ...... *H01L 29/0696* (2013.01); *H01L 29/0619* (2013.01); *H01L 29/0834* (2013.01);
(Continued)

(58) Field of Classification Search
CPC ............. H01L 29/0696; H01L 29/7813; H01L 29/7825; H01L 29/66325; H01L 29/41708; H05K 2201/09781
See application file for complete search history.

(56) References Cited

U.S. PATENT DOCUMENTS

2004/0178441 A1* 9/2004 Yanagisawa ........ H01L 29/1095
257/327
2004/0238884 A1* 12/2004 Tanaka ................ H01L 29/0619
257/341
(Continued)

FOREIGN PATENT DOCUMENTS

JP H10-163483 A 6/1998
JP 2004-349634 A 12/2004
(Continued)

OTHER PUBLICATIONS

An Office Action; "Notice of Reasons for Refusal," issued by the Japanese Patent Office dated May 22, 2018, which corresponds to Japanese Patent Application No. 2017-535185 and is related to U.S. Appl. No. 15/570,442; with English Translation.
(Continued)

*Primary Examiner* — Thao X Le
*Assistant Examiner* — Laura M Dykes
(74) *Attorney, Agent, or Firm* — Studebaker & Brackett PC (57) ABSTRACT

A third dummy trench (11) is orthogonal to the first and second dummy trenches (9,10) in the dummy cell region of a substrate end portion. An interlayer insulating film (13) insulates the p-type diffusion layer (3,4) in the dummy cell region of a substrate center portion situated between the first and second dummy trenches (9,10) from the emitter electrode (14). The third dummy trench (11) separates the p-type diffusion layer (3,4) in the dummy cell region of the substrate center portion from the p-type diffusion layer (3,4,15)
(Continued)

in the dummy cell region of the substrate end portion connected to the emitter electrode (14). A p-type well layer (15) is provided deeper than the third dummy trench (11) in the substrate end portion. The third dummy trench (11) is provided closer to a center of the n-type substrate than the p-type well layer (15).

13 Claims, 12 Drawing Sheets (51) Int. Cl.
    *H01L 29/08*     (2006.01)
    *H01L 29/10*     (2006.01)
    *H01L 29/40*     (2006.01)
    *H01L 29/739*    (2006.01)

(52) U.S. Cl.
    CPC ........ *H01L 29/1095* (2013.01); *H01L 29/404* (2013.01); *H01L 29/407* (2013.01); *H01L 29/7397* (2013.01); *H01L 29/78* (2013.01)

(56) References Cited

U.S. PATENT DOCUMENTS

| | | | |
|---|---|---|---|
| 2009/0283797 A1 | 11/2009 | Takahashi et al. | |
| 2010/0140695 A1* | 6/2010 | Yedinak | H01L 29/7827 257/334 |
| 2011/0260212 A1* | 10/2011 | Tsuzuki | H01L 29/0696 257/139 |
| 2012/0326207 A1* | 12/2012 | Yoshimochi | H01L 29/866 257/139 |
| 2013/0037853 A1* | 2/2013 | Onozawa | H01L 29/0661 257/139 |
| 2015/0021657 A1* | 1/2015 | Ogura | H01L 29/1095 257/139 |
| 2015/0262999 A1* | 9/2015 | Ogura | H01L 29/7397 257/140 |
| 2016/0372585 A1* | 12/2016 | Furukawa | H01L 29/0804 |

FOREIGN PATENT DOCUMENTS

| | | |
|---|---|---|
| JP | 2009-188290 A | 8/2009 |
| JP | 2009-277792 A | 11/2009 |

OTHER PUBLICATIONS

Notification of Transmittal of Translation of the International Preliminary Report on Patentability and Translation of Written Opinion of the International Searching Authority; PCT/JP2015/073209; dated Mar. 1, 2018.

International Search Report issued in PCT/JP2015/073209; dated Nov. 24, 2015.

* cited by examiner

SEMICONDUCTOR DEVICE INCLUDING ACTIVE AND DUMMY CELL REGIONS

FIELD

The present invention relates to a semiconductor device.

BACKGROUND

Power semiconductor devices including a gate trench having a MOS gate function and a dummy trench having no MOS gate function are used. In such devices, a contact between a dummy cell region situated between dummy trenches and an emitter electrode is provided only at a substrate end portion (e.g., see PTL 1).

CITATION LIST

Parent Literature

[PTL 1]
JP 2009-277792 A

SUMMARY

Technical Problem

It is possible, through a hole accumulation effect of a dummy cell region, to improve a trade-off relationship between an on-voltage and switching loss. However, a potential of the dummy cell region differs between an end portion of a substrate and a center portion of the substrate, and so the hole accumulation effect differs between the end portion of the substrate and the center portion of the substrate. A difference in on-resistance caused by this induces current unbalance in the substrate.

The present invention has been implemented to solve the above-described problem and it is an object of the present invention to provide a semiconductor device capable of reducing current unbalance in a substrate.

Solution to Problem

A semiconductor device according to the present invention includes: an n-type substrate including an active cell region and a dummy cell region; a p-type diffusion layer provided on a top surface side of the n-type substrate; an n-type emitter layer provided at a part on the p-type diffusion layer in the active cell region; a gate trench penetrating the p-type diffusion layer and the n-type emitter layer in the active cell region; first and second dummy trenches provided parallel to the gate trench in a plan view and penetrating the p-type diffusion layer in the dummy cell region; a third dummy trench penetrating the p-type diffusion layer in the dummy cell region of a substrate end portion and being orthogonal to the first and second dummy trenches; an emitter electrode connected to the n-type emitter layer, the p-type diffusion layer in the active cell region and the p-type diffusion layer in the dummy cell region of the substrate end portion; an interlayer insulating film insulating the p-type diffusion layer in the dummy cell region of a substrate center portion situated between the first and second dummy trenches from the emitter electrode; a p-type collector layer provided on a bottom surface side of the n-type substrate; and a collector electrode connected to the p-type collector layer, wherein the third dummy trench separates the p-type diffusion layer in the dummy cell region of the substrate center portion from the p-type diffusion layer in the dummy cell region of the substrate end portion connected to the emitter electrode, the p-type diffusion layer includes a p-type well layer provided deeper than the third dummy trench in the substrate end portion, and the third dummy trench is provided closer to a center of the n-type substrate than the p-type well layer.

Advantageous Effects of Invention

In the present invention, the third dummy trench separates the p-type diffusion layer in the dummy cell region in the substrate center portion from the p-type diffusion layer in the dummy cell region of the substrate end portion connected to the emitter electrode. Furthermore, the third dummy trench is provided closer to a center of the n-type substrate than the p-type well layer, and this prevents the deep p-type well layer from impairing the separation function between the substrate center portion and the substrate end portion. This allows the substrate center portion and the substrate end portion to maintain a hole accumulation effect in a uniform condition. As a result, it is possible to reduce current unbalance within the substrate without deteriorating a trade-off relationship between an on-voltage and switching loss.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
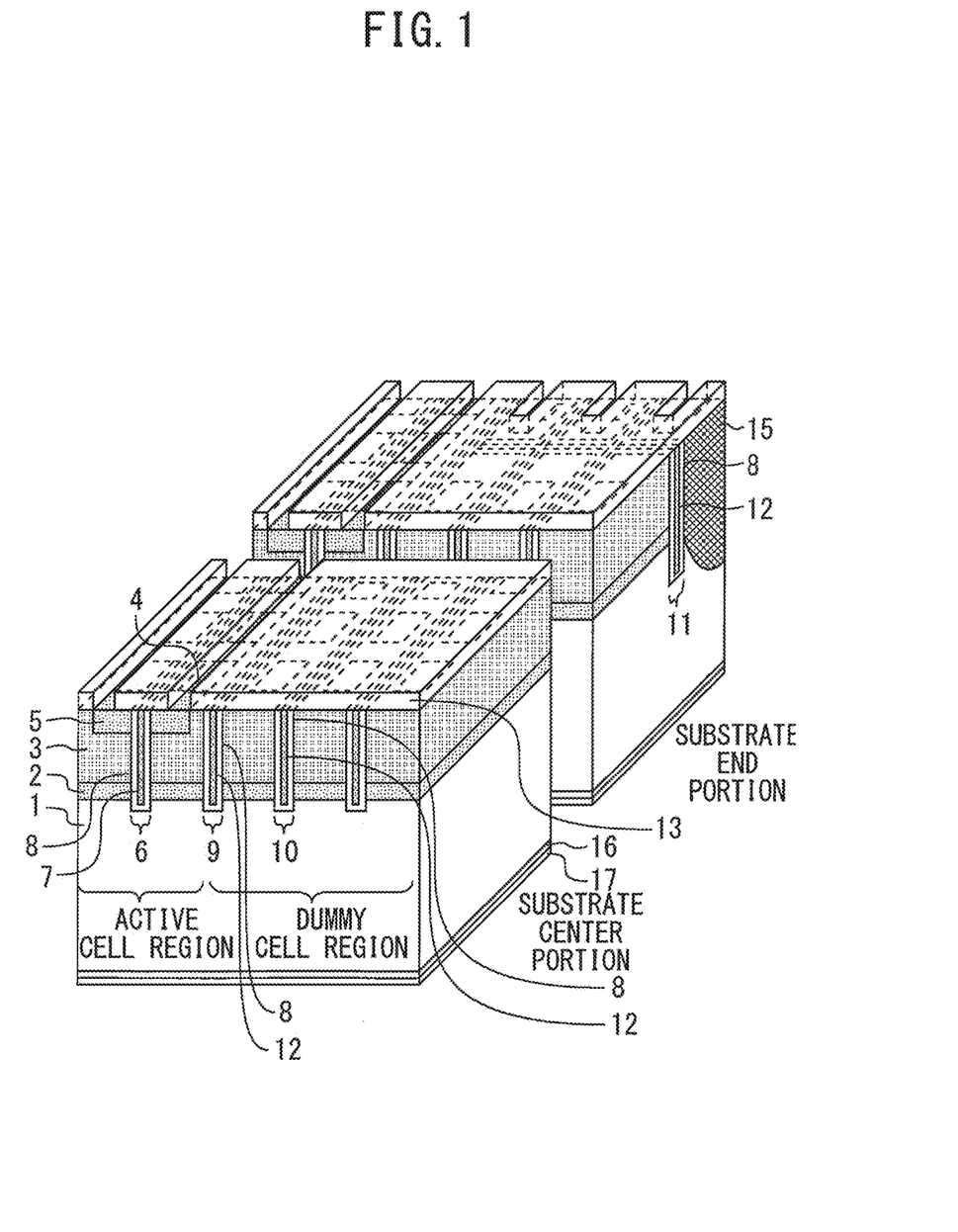
FIG. 1 is a perspective view illustrating a semiconductor device according to a first embodiment of the present invention.
Figure 2:
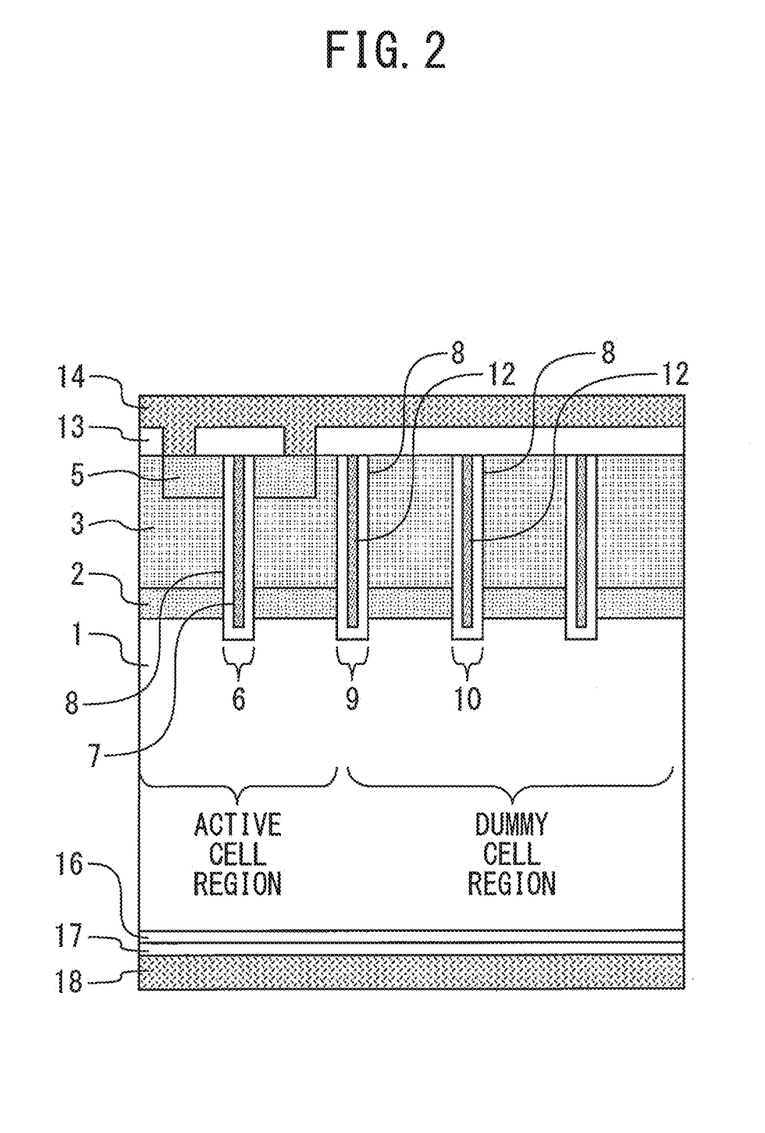
FIG. 2 is a cross-sectional view illustrating the semiconductor device according to the first embodiment of the present invention.
Figure 3:
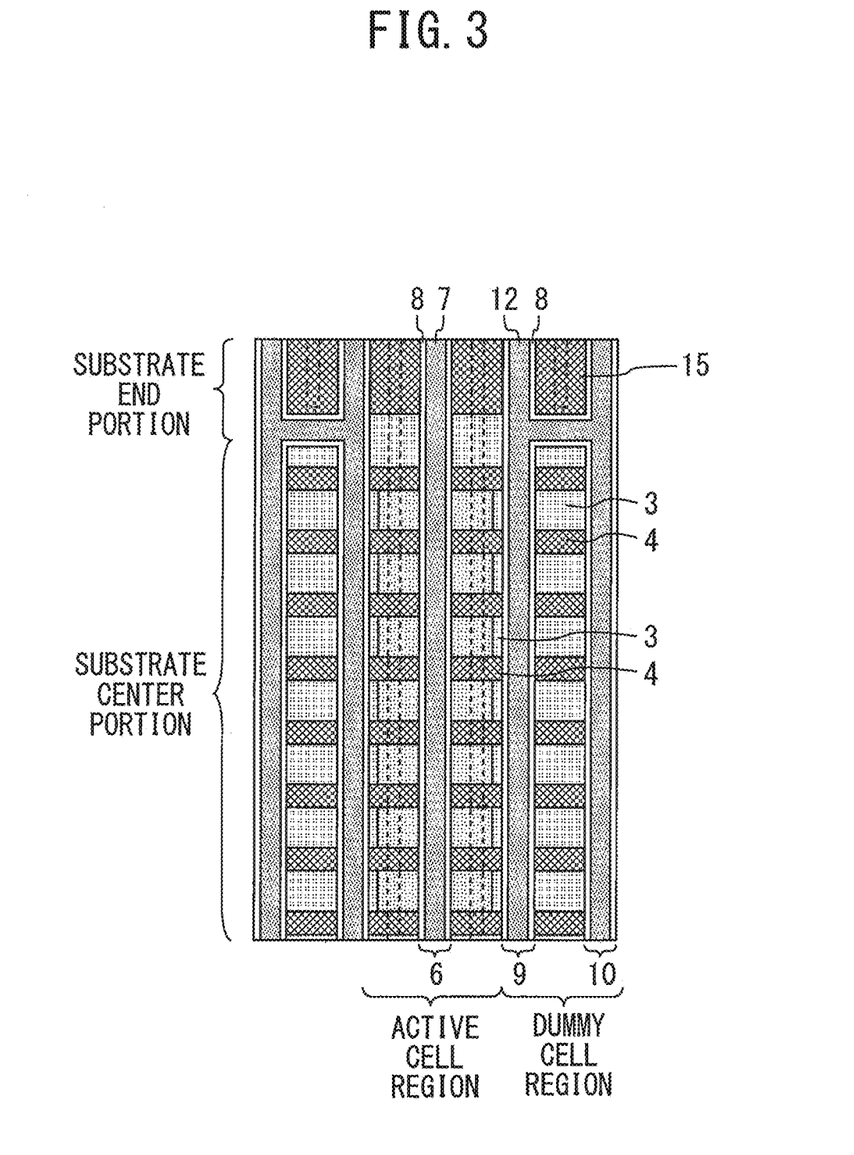
FIG. 3 is a top view illustrating the substrate of the semiconductor device according to the first embodiment of the present invention.

FIG. 1 is a perspective view illustrating a semiconductor device according to a first embodiment of the present invention. FIG. 2 is a cross-sectional view illustrating the semiconductor device according to the first embodiment of the present invention. FIG. 3 is a top view illustrating the substrate of the semiconductor device according to the first embodiment of the present invention. This semiconductor device is an IGBT (insulated gate bipolar transistor) having a CSTBT (carrier stored trench gate bipolar transistor) structure.

An n-type substrate 1 includes an active cell region that substantially operates as a transistor and a dummy cell region that does not operate as a transistor. An n-type charge storage layer 2 and a p-type base layer 3 are provided in order on a top surface side of the n-type substrate 1. A p$^+$-type contact layer 4 is provided at a part on the p-type base layer 3. An n$^+$-type emitter layer 5 is provided at a part on the p-type base layer 3 in the active cell region.

A gate trench 6 penetrates the n-type charge storage layer 2, the p-type base layer 3, the p$^+$-type contact layer 4 and the n$^+$-type emitter layer 5 in the active cell region. An active gate 7 is provided in the gate trench 6 via a gate oxide film 8.

First and second dummy trenches 9 and 10 provided parallel to the gate trench 6 in a plan view penetrate the n-type charge storage layer 2, the p-type base layer 3 and the p$^+$-type contact layer 4 in the dummy cell region. A third dummy trench 11 penetrates the p-type base layer 3 in the dummy cell region of a substrate end portion and is orthogonal to the first and second dummy trenches 9 and 10. A dummy gate 12 is provided in the first, second and third dummy trenches 9, 10 and 11 via the gate oxide film 8.

In the substrate end portion, a p-type well layer 15 is provided deeper than the p-type base layer 3 and the third dummy trench 11. An interlayer insulating film 13 is provided on the p-type base layer 3 or the like and an emitter electrode 14 is provided thereon. An n-type buffer layer 16 and a p-type collector layer 17 are provided in order on a bottom surface side of the n-type substrate 1. A collector electrode 18 is connected to the p-type collector layer 17.

The emitter electrode 14 is connected to the n$^+$-type emitter layer 5, the p-type base layer 3 and the p$^+$-type contact layer 4 in the active cell region and the p-type well layer 15 in the dummy cell region of the substrate end portion through a punching pattern of the interlayer insulating film 13. The interlayer insulating film 13 insulates the p-type base layer 3 and the p$^+$-type contact layer 4 in the dummy cell region of the substrate center portion situated between the first and second dummy trenches 9 and 10 from the emitter electrode 14. The third dummy trench 11 separates a p-type diffusion layer such as the p-type base layer 3 in the dummy cell region of the substrate center portion from a p-type diffusion layer such as the p-type well layer 15 in the dummy cell region of the substrate end portion connected to the emitter electrode 14.

The p-type diffusion layer enclosed by the first, second and third dummy trenches 9, 10 and 11 has a floating potential. The p-type well layer 15 is provided in the substrate end portion to reduce electric field strength with a curvature at the end portion of this floating p-type diffusion layer. However, the third dummy trench 11 is provided closer to the center of the n-type substrate 1 than the p-type well layer 15 in order to prevent the substrate center portion side and the substrate end portion side across the third dummy trench 11 from being electrically connected via the p-type well layer 15.

As described above, according to the present embodiment, the third dummy trench 11 separates the p-type diffusion layer in the dummy cell region in the substrate center portion from the p-type diffusion layer in the dummy cell region of the substrate end portion connected to the emitter electrode 14. Furthermore, the third dummy trench 11 is provided closer to the center of the n-type substrate 1 than the p-type well layer 15, and this prevents the deep p-type well layer 15 from impairing the separation function between the substrate center portion and the substrate end portion. This allows the substrate center portion and the substrate end portion to maintain a hole accumulation effect in a uniform condition. As a result, it is possible to reduce current unbalance within the substrate without deteriorating a trade-off relationship between an on-voltage and switching loss.

Figure 4:
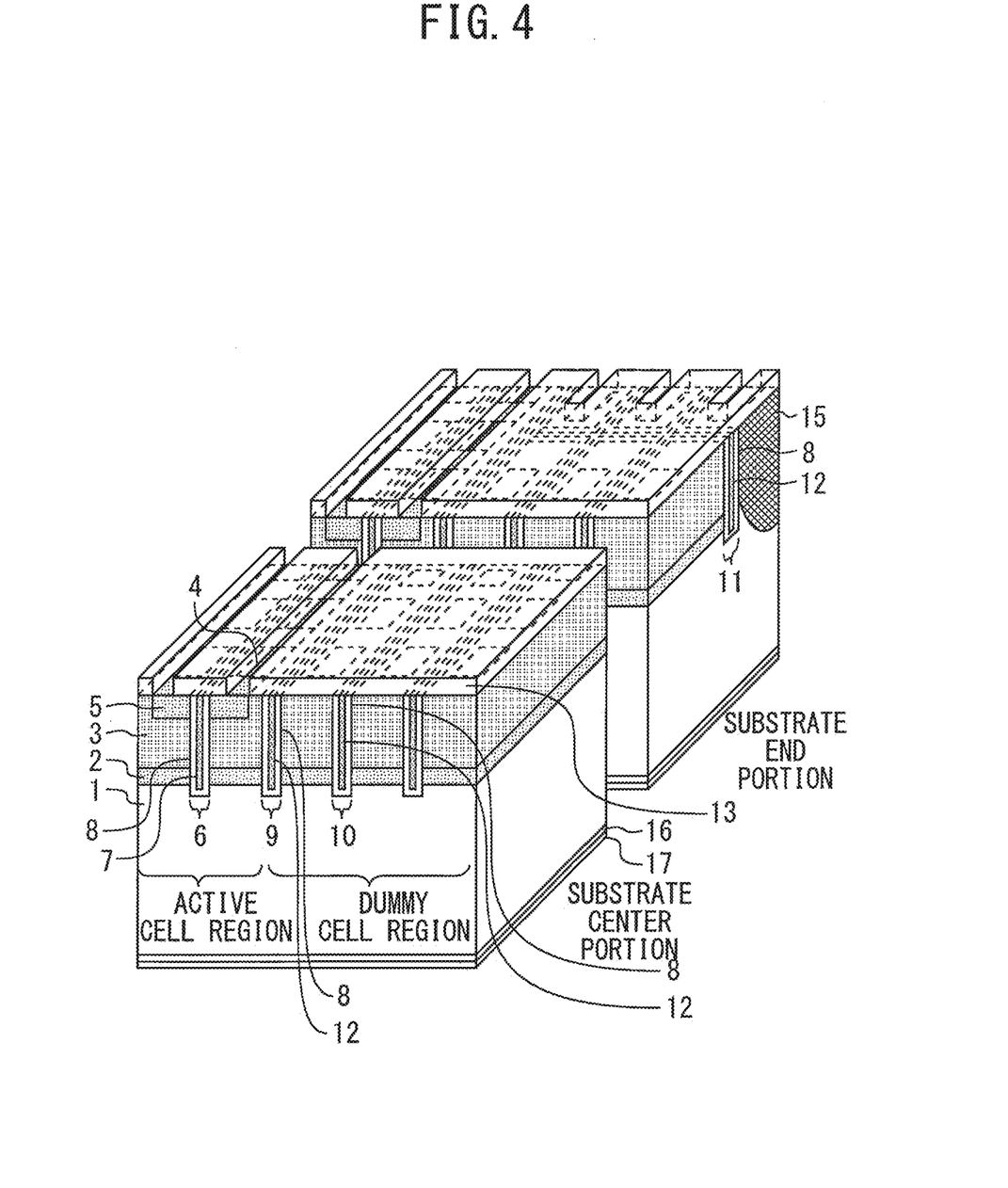
FIG. 4 is a perspective view illustrating a modification 1 of the semiconductor device according to the first embodiment of the present invention.

FIG. 4 is a perspective view illustrating a modification 1 of the semiconductor device according to the first embodiment of the present invention. In the modification 1, the gate trench 6 is as deep as the first, second and third dummy trenches 9, 10 and 11. Therefore, it is possible to form the first, second and third dummy trenches 9, 10 and 11 simultaneously with the normal gate trench 6, and thereby reduce the number of steps.

Figure 5:
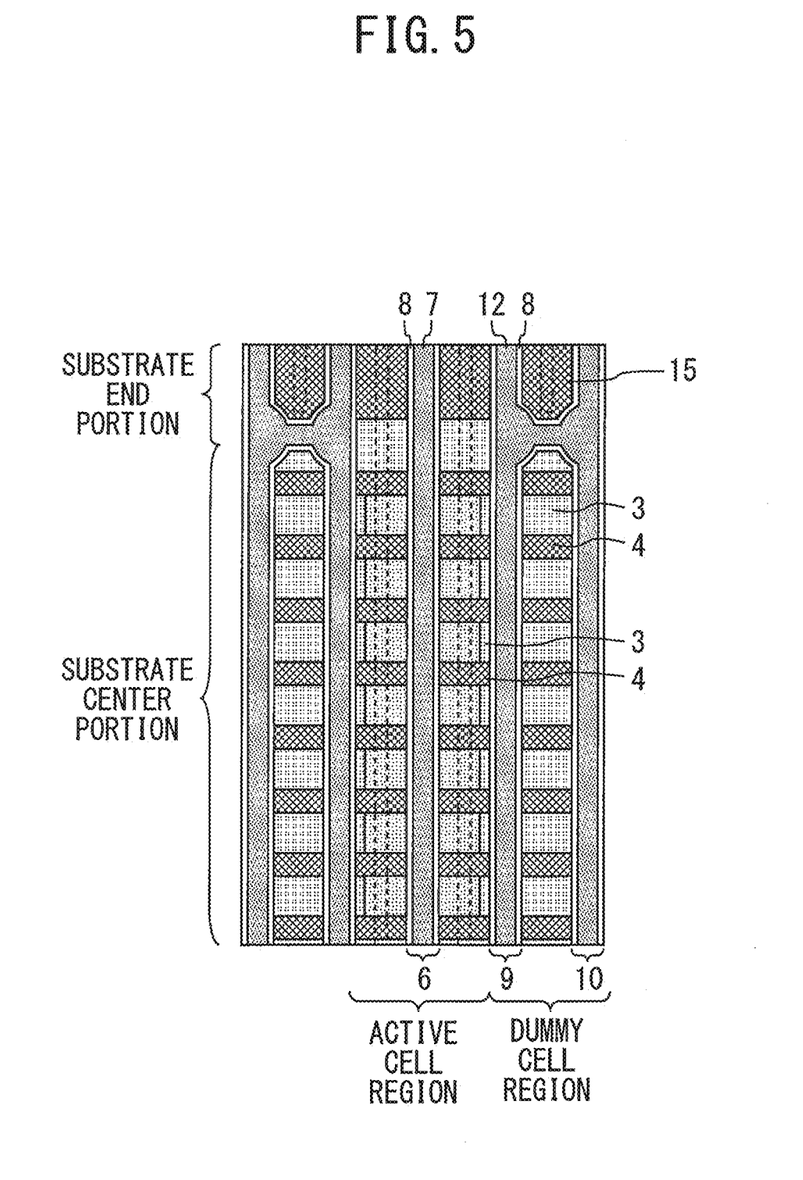
FIG. 5 is a top view illustrating a substrate of a modification 2 of the semiconductor device according to the first embodiment of the present invention.
Figure 6:
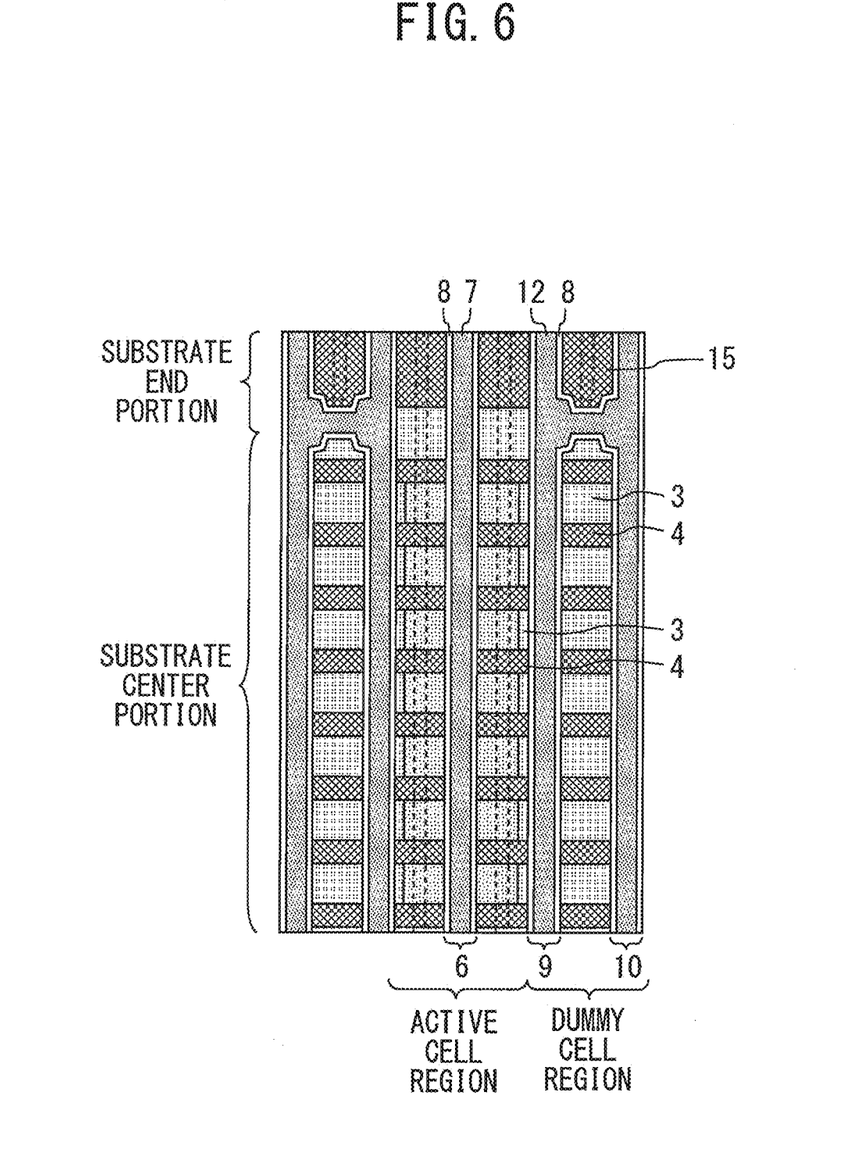
FIG. 6 is a top view illustrating a substrate of a modification 3 of the semiconductor device according to the first embodiment of the present invention.
Figure 7:
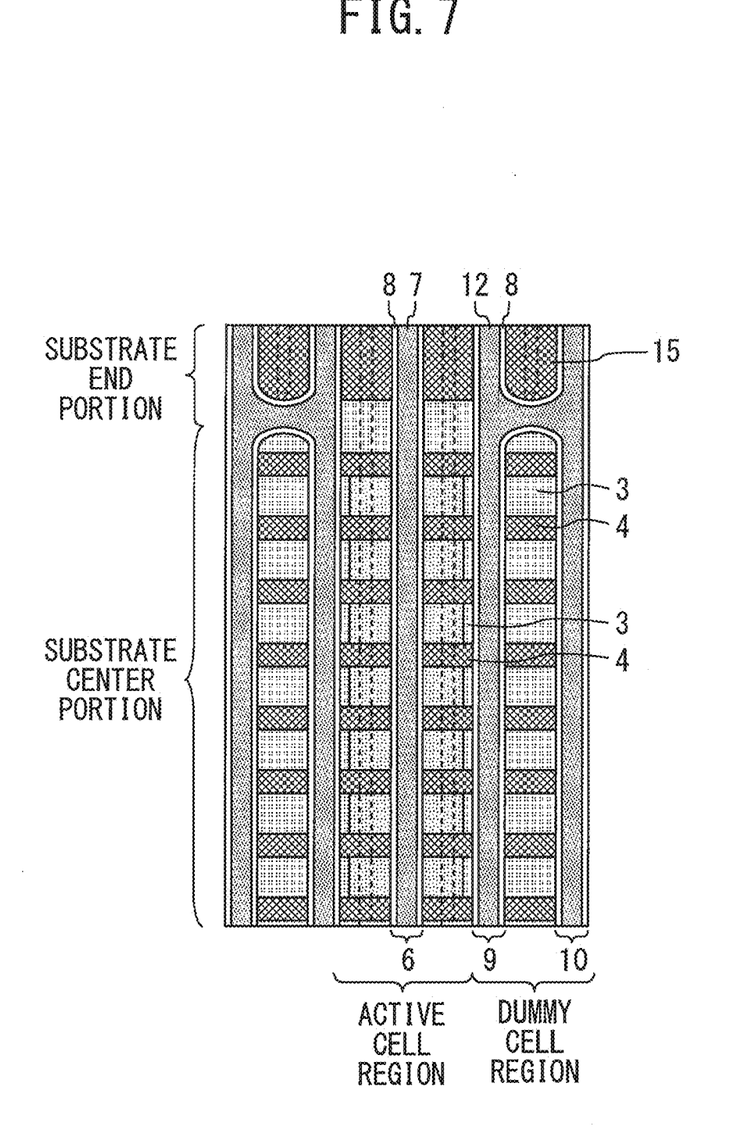
FIG. 7 is a top view illustrating a substrate of a modification 4 of the semiconductor device according to the first embodiment of the present invention.

FIG. 5 is a top view illustrating a substrate of a modification 2 of the semiconductor device according to the first embodiment of the present invention. FIG. 6 is a top view illustrating a substrate of a modification 3 of the semiconductor device according to the first embodiment of the present invention. FIG. 7 is a top view illustrating a substrate of a modification 4 of the semiconductor device according to the first embodiment of the present invention. Intersections between the first and second dummy trenches 9 and 10, and the third dummy trench 11 are semicircular in a plan view in the modification 2, whereas they are polygonal in the modification 3. In the modification 4, intersections between trenches are provided with a curvature. Setting such shapes for the intersections between trenches makes it possible to prevent local electric-field concentration.

Second Embodiment

Figure 8:
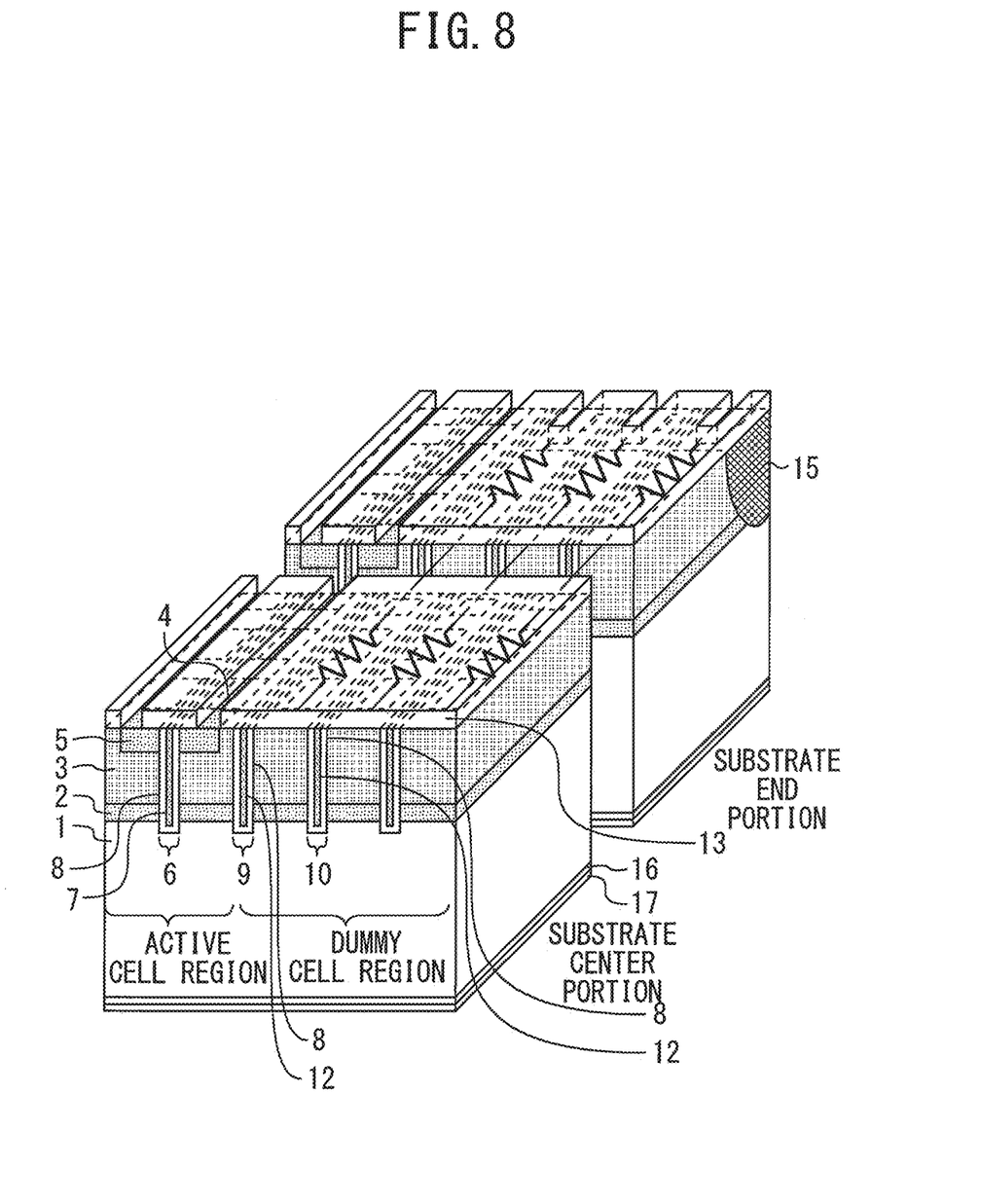
FIG. 8 is a perspective view illustrating a semiconductor device according to a second embodiment of the present invention.
Figure 9:
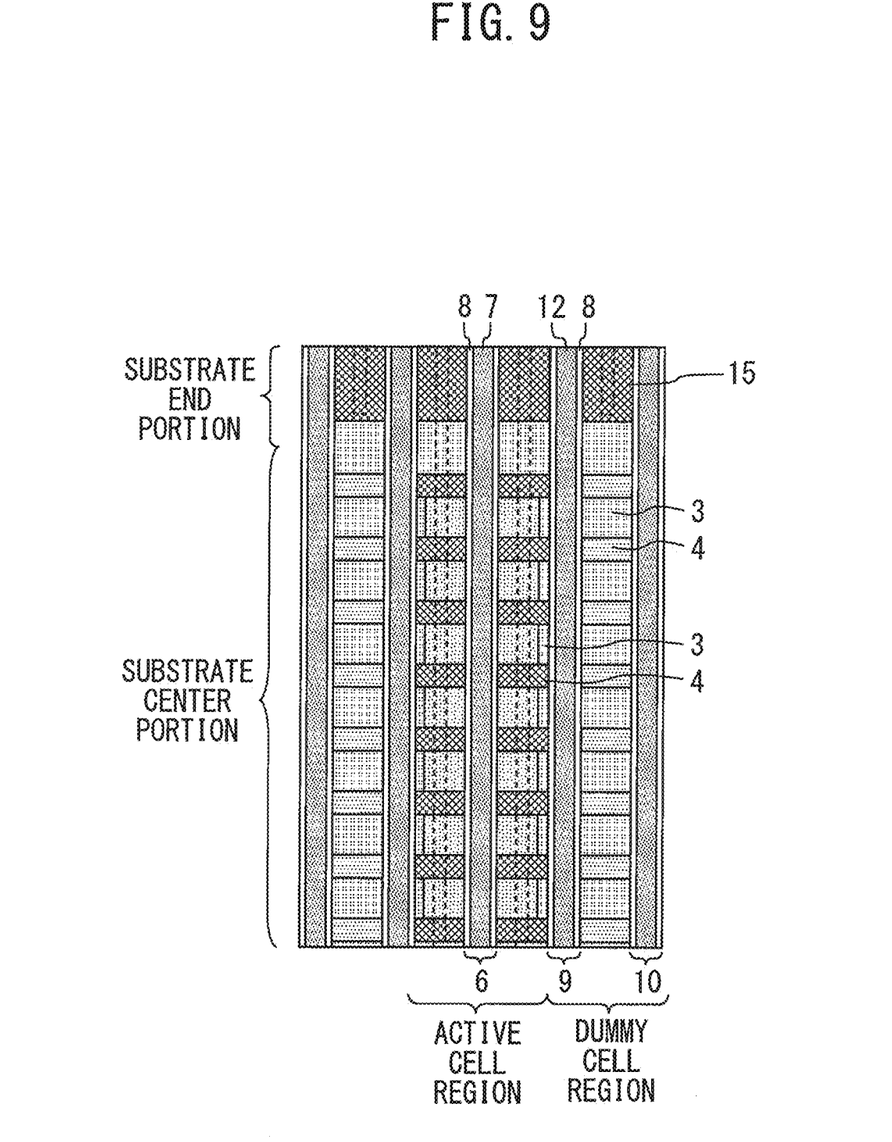
FIG. 9 is a top view illustrating a substrate of the semiconductor device according to the second embodiment of the present invention.

FIG. 8 is a perspective view illustrating a semiconductor device according to a second embodiment of the present invention. FIG. 9 is a top view illustrating a substrate of the semiconductor device according to the second embodiment of the present invention. In the present embodiment, impurity concentration of the p-type base layer 3 and the p$^+$-type contact layer 4 in the dummy cell region is made lower than impurity concentration of the p-type base layer 3 and the p$^+$-type contact layer 4 in the active cell region instead of the third dummy trench 11 of the first embodiment. The rest of the configuration is the same as that of the first embodiment.

Since diffusion resistance of the p-type diffusion layer in the dummy cell region is higher than diffusion resistance of the p-type diffusion layer in the active cell region, it is possible to maintain a hole accumulation effect in a uniform condition between the substrate center portion and the substrate end portion in the floating p-type diffusion layer of the dummy cell region. It is thereby possible to reduce current unbalance in the substrate.

Figure 10:
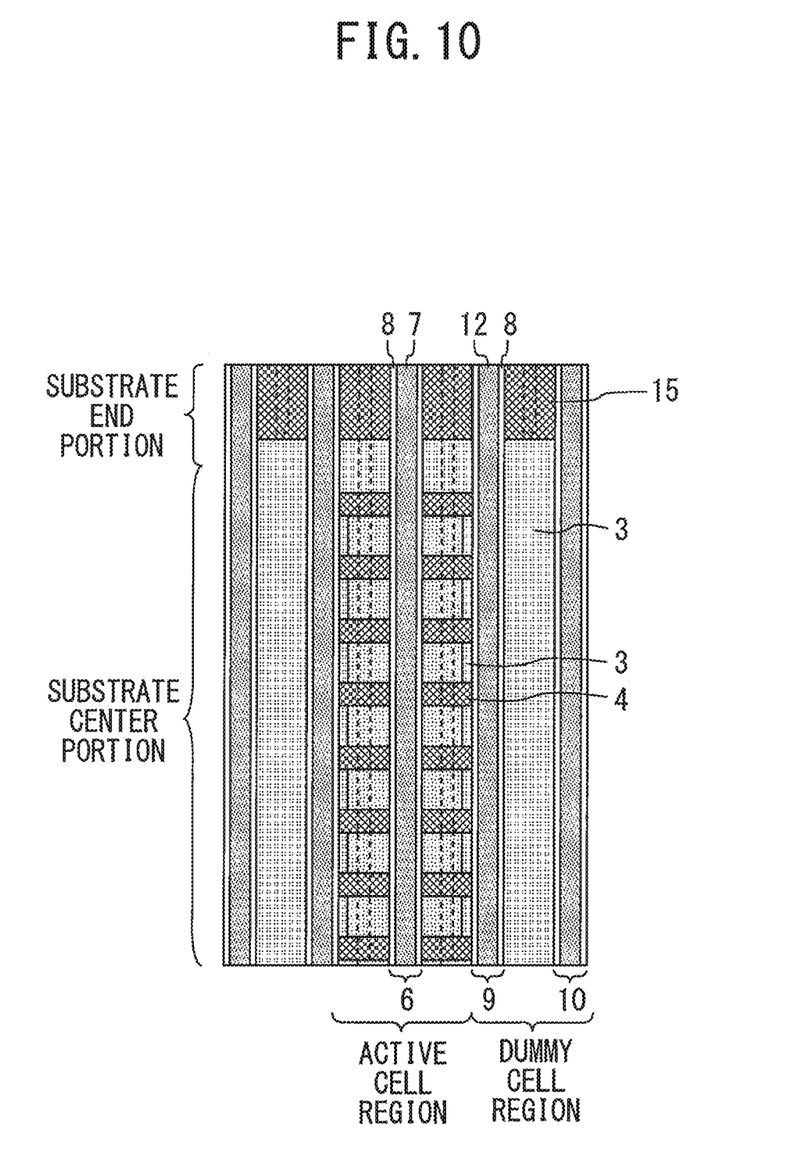
FIG. 10 is a top view illustrating a substrate of a modification of the semiconductor device according to the second embodiment of the present invention.

FIG. 10 is a top view illustrating a substrate of a modification of the semiconductor device according to the second embodiment of the present invention. Similar effects can also be obtained without providing any p+-type contact layer 4 in the dummy cell region.

Third Embodiment

Figure 11:
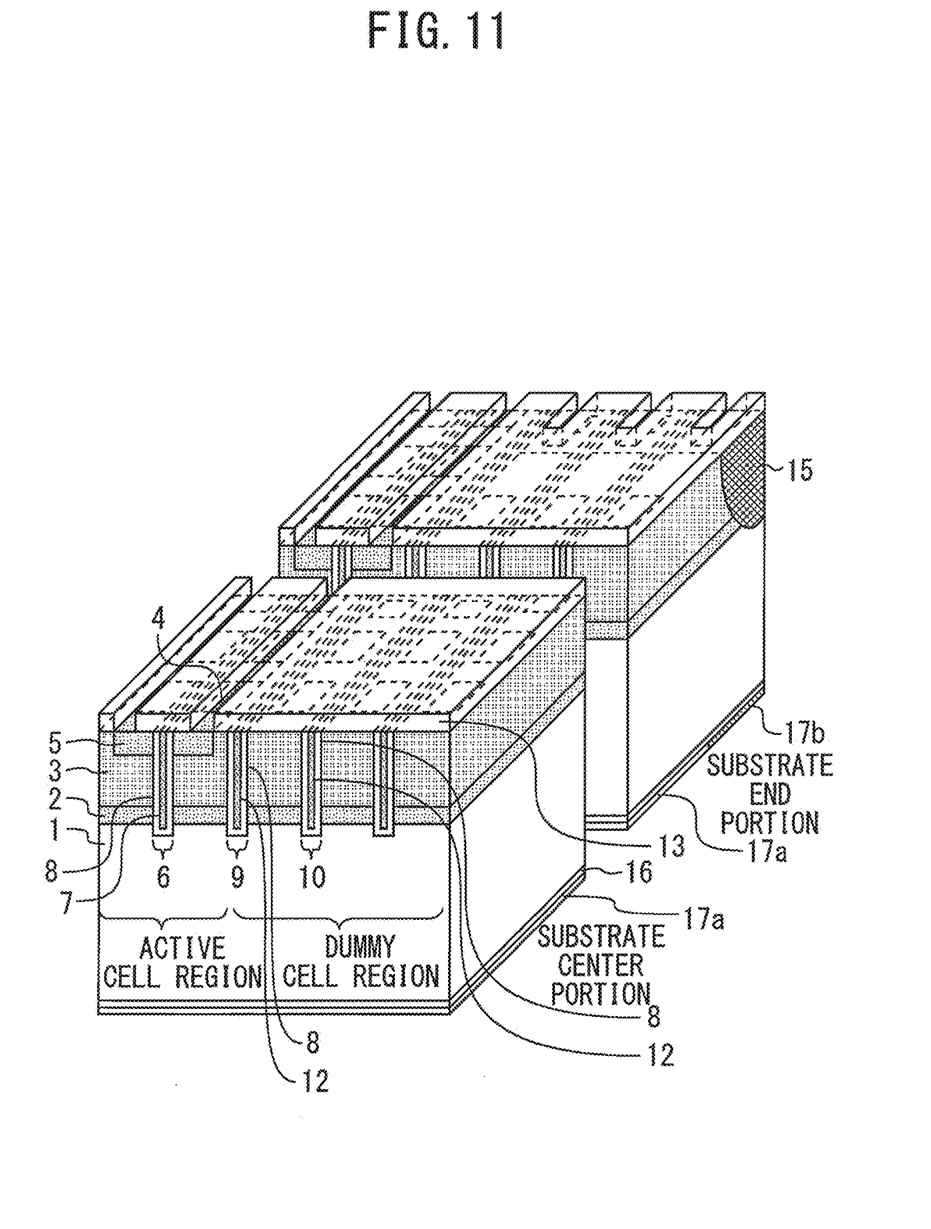
FIG. 11 is a perspective view illustrating a semiconductor device according to a third embodiment of the present invention.
Figure 12:
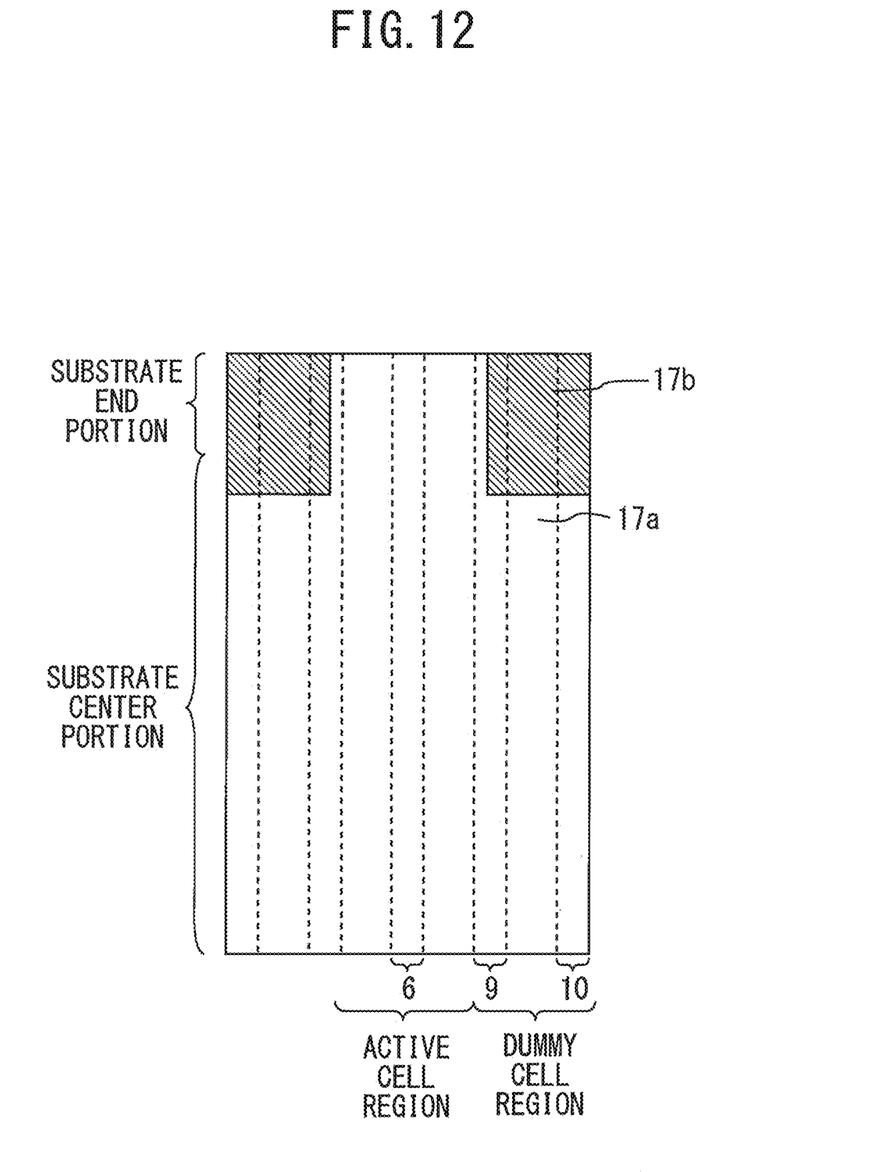
FIG. 12 is a bottom view illustrating a substrate of the semiconductor device according to the third embodiment of the present invention.

FIG. 11 is a perspective view illustrating a semiconductor device according to a third embodiment of the present invention. FIG. 12 is a bottom view illustrating a substrate of the semiconductor device according to the third embodiment of the present invention. In the present embodiment, instead of the third dummy trench 11 of the first embodiment, a first p-type collector layer 17a provided in the active cell region and the dummy cell region of the substrate center portion, and a second p-type collector layer 17b provided in the dummy cell region of the substrate end portion having higher impurity concentration than that of the first p-type collector layer 17a are provided as the p-type collector layers. The second p-type collector layer 17b is not limited to directly below the p-type well layer 15, and has a floating structure in which impurity concentration gradually decreases toward the substrate center portion.

Holes are more likely to escape in the dummy cell region of the substrate end portion connected to the emitter electrode 14. Thus, in the present embodiment, the p-type collector layer is caused to have high concentration in the relevant region to increase the amount of hole injection. This makes it possible to reduce current unbalance in the substrate.

Note that the semiconductor devices according to the first to third embodiments are not limited to those formed of silicon, but may be formed of wide bandgap semiconductors having a larger bandgap. Examples of the wide bandgap semiconductors include silicon carbide, nitride gallium-based material or diamond. A semiconductor device formed of such a wide bandgap semiconductor has high withstand voltage performance and a high allowable current density, and can thereby be miniaturized. Using such a miniaturized semiconductor device also allows a semiconductor module incorporating this semiconductor device to be miniaturized. Moreover, since the semiconductor device has high heat resistance, it is possible to reduce the size of radiator fins of a heat sink and adopt an air cooling system instead of a water cooling system, and thereby further miniaturize the semiconductor module. Moreover, since the semiconductor device has lower power loss and achieves high efficiency, it is possible to make the semiconductor module highly efficient.

REFERENCE SIGNS LIST 1 n-type substrate; 3 p-type base layer (p-type diffusion layer); 4 p+-type contact layer (p-type diffusion layer); 5 n+-type emitter layer; 6 gate trench; 9 first dummy trench; 10 second dummy trench; 11 third dummy trench; 13 interlayer insulating film; 14 emitter electrode; 15 p-type well layer (p-type diffusion layer); 17 p-type collector layer; 17a first p-type collector layer; 17b second p-type collector layer; 18 collector electrode

The invention claimed is:

1. A semiconductor device comprising:
an n-type substrate including an active cell region and a dummy cell region;
a p-type diffusion layer provided on a top surface side of the n-type substrate;
an n-type emitter layer provided at a part on the p-type diffusion layer in the active cell region;
a gate trench penetrating the p-type diffusion layer and the n-type emitter layer in the active cell region;
first and second dummy trenches provided parallel to the gate trench in a plan view and penetrating the p-type diffusion layer in the dummy cell region;
a third dummy trench penetrating the p-type diffusion layer in the dummy cell region of a substrate end portion and being orthogonal to the first and second dummy trenches;
an emitter electrode connected to the n-type emitter layer, the p-type diffusion layer in the active cell region and the p-type diffusion layer in the dummy cell region of the substrate end portion;
an interlayer insulating film insulating the p-type diffusion layer in the dummy cell region of a substrate center portion situated between the first and second dummy trenches from the emitter electrode;
a p-type collector layer provided on a bottom surface side of the n-type substrate; and
a collector electrode connected to the p-type collector layer,
wherein the third dummy trench separates the p-type diffusion layer in the dummy cell region of the substrate center portion from the p-type diffusion layer in the dummy cell region of the substrate end portion connected to the emitter electrode,
the p-type diffusion layer includes a p-type well layer provided deeper than the third dummy trench in the substrate end portion, and
the third dummy trench is provided closer to a center of the n-type substrate than the p-type well layer.

2. The semiconductor device according to claim 1, wherein the gate trench is as deep as the first, second and third dummy trenches.

3. The semiconductor device according to claim 1 or 2, wherein intersections between the first and second dummy trenches and the third dummy trench are semicircular or polygonal or provided with a curvature in a plan view.

4. The semiconductor device according to claim 1, wherein
the third dummy trench intersects the first and second dummy trenches.

5. The semiconductor device according to claim 1, wherein
the substrate end portion is formed at an end of the substrate in a length direction of the gate trench and the first and second dummy trenches.

6. The semiconductor device according to claim 5, wherein
the length direction is perpendicular to each of a spacing direction between the first and second dummy trenches and the gate trench, and another direction, which is perpendicular to the spacing direction and directed toward the p-type collector layer.

7. A semiconductor device comprising:
an n-type substrate including an active cell region and a dummy cell region;
a p-type diffusion layer provided on a top surface side of the n-type substrate;
an n-type emitter layer provided at a part on the p-type diffusion layer in the active cell region;
a gate trench penetrating the p-type diffusion layer and the n-type emitter layer in the active cell region;

first and second dummy trenches provided parallel to the gate trench in a plan view and penetrating the p-type diffusion layer in the dummy cell region;
an emitter electrode connected to the n-type emitter layer, the p-type diffusion layer in the active cell region and the p-type diffusion layer in the dummy cell region of a substrate end portion;
an interlayer insulating film insulating the p-type diffusion layer in a substrate center portion situated between the first and second dummy trenches from the emitter electrode;
a p-type collector layer provided on a bottom surface side of the n-type substrate; and
a collector electrode connected to the p-type collector layer,
wherein an impurity concentration of the p-type diffusion layer in the dummy cell region is lower than an impurity concentration of the p-type diffusion layer in the active cell region,
the active cell region and the dummy cell region are separated from each other by the first or second dummy trench, and
the substrate end portion is formed at an end of the substrate in a length direction of the gate trench and the first and second dummy trenches.

8. The semiconductor device according to claim 7, wherein
the length direction is perpendicular to each of a spacing direction between the first and second dummy trenches and the gate trench, and another direction, which is perpendicular to the spacing direction and directed toward the p-type collector layer.

9. A semiconductor device comprising:
an n-type substrate including an active cell region and a dummy cell region;
a p-type diffusion layer provided on a top surface side of the n-type substrate;
an n-type emitter layer provided at a part on the p-type diffusion layer in the active cell region;
a gate trench penetrating the p-type diffusion layer and the n-type emitter layer in the active cell region;
first and second dummy trenches provided parallel to the gate trench in a plan view and penetrating the p-type diffusion layer in the dummy cell region;
an emitter electrode connected to the n-type emitter layer, the p-type diffusion layer in the active cell region and the p-type diffusion layer in the dummy cell region of a substrate end portion;
an interlayer insulating film insulating the p-type diffusion layer in a substrate center portion situated between the first and second dummy trenches from the emitter electrode;
a p-type collector layer provided on a bottom surface side of the n-type substrate; and
a collector electrode connected to the p-type collector layer,
wherein the p-type collector layer includes a first p-type collector layer provided in the active cell region and the dummy cell region of the substrate center portion, and a second p-type collector layer provided in the dummy cell region of the substrate end portion and having higher impurity concentration than that of the first p-type collector layer.

10. The semiconductor device according to claim 9, wherein the second p-type collector layer has a floating structure in which impurity concentration gradually decreases toward the substrate center portion.

11. The semiconductor device according to claim 9, wherein
the interlayer insulating film is provided between the emitter electrode and the p-type diffusion layer to insulate the p-type diffusion layer from the emitter electrode.

12. The semiconductor device according to claim 9, wherein
the substrate end portion is formed at an end of the substrate in a length direction of the gate trench and the first and second dummy trenches.

13. The semiconductor device according to claim 12, wherein
the length direction is perpendicular to each of a spacing direction between the first and second dummy trenches and the gate trench, and another direction, which is perpendicular to the spacing direction and directed toward the p-type collector layer.

* * * * *